United States Patent [19]

Wheeland et al.

[11] Patent Number: 4,831,335

[45] Date of Patent: May 16, 1989

[54] HIGH GAIN MINIATURE CROSSED-FIELD AMPLIFIER

[75] Inventors: Chris L. Wheeland; Guilford R. MacPhail, both of Williamsport, Pa.

[73] Assignee: Litton Systems, Inc., Woodland Hills, Calif.

[21] Appl. No.: 195,074

[22] Filed: May 17, 1988

[51] Int. Cl.[4] .......................... H03F 3/54; H01J 25/34
[52] U.S. Cl. ...................................... 330/47; 315/39.3
[58] Field of Search ....................... 313/22, 30, 32, 39; 315/39.3, 39.51, 39.71; 330/47, 48; 331/86, 87

[56] References Cited

U.S. PATENT DOCUMENTS 4,480,235 10/1984 Gerard ........................ 315/39.67 X
4,677,342 6/1987 MacMaster et al. ............... 315/39.3
4,742,271 5/1988 MacMaster et al. ............... 315/39.3

*Primary Examiner*—Steven Mottola

[57] ABSTRACT

There is provided a miniature high gain forward wave crossed-field amplifier wherein the anode slow wave structure includes double helix coupled vanes having a predetermined pitch such that the distance between the plane of symmetry of each vane is substantially narrow as compared with the thickness of each vane. The vanes also having a predetermined length and height, the height being greater than one half of the length. The wires of the double helical coils has a cross-sectional thickness which is at least one order of magnitude less than the plane of symmetry diameter of each turn of the coils. The distance between the outer diameter of each coil along the transverse face of each vane is quite large. The pitch ratio of the vanes is less than one half of the thickness thereof. Samarium cobalt magnets are used having annular end pieces which form the walls of the vacuum chamber. A high gain of 18 to 22 dB in a volume of approximately 50 cubic inches and a weight of less than 10 pounds is achieved.

9 Claims, 2 Drawing Sheets

HIGH GAIN MINIATURE CROSSED-FIELD AMPLIFIER

The present invention has been subject to Government funding (USAF Contract No. F 8635-87-C-0153).

FIELD OF THE INVENTION

The present invention relates to crossed-field amplifiers and, more particularly, to a miniature high gain crossed-field amplifier.

BACKGROUND OF THE INVENTION

Prior art forward crossed-field amplifiers have been used with increasing frequency in electronic systems which require high RF power, such as radar systems. However, because such prior art crossed-field amplifiers are relatively heavy (i.e., about 25 pounds) require a complicated and cumbersome high RF power source, which also adds to the weight of the overall system, such prior art crossed-field amplifiers are not optimal for airborne applications and have typically been restricted to use in ground and shipboard applications. Additionally, these prior art crossed field amplifiers occupy a relatively large volume thereby making airborne applications even less desirable. At least one prior art forward wave crossed field amplifier is believed to have been used for an airborne application during the NASA lunar space flights, however, this crossed-field amplifier had a low gain and an extremely narrow bandwidth as compared with other prior art crossed-field amplifiers and would not be desirous for more conventional uses.

In airborne applications, traveling wave tubes are typically used for amplifying an RF wave since they are light in weight and have a high gain, as compared with prior art crossed-field amplifiers, and therefore may be used with a lightweight solid state RF power source. However, traveling wave tubes are expensive to build and manufacture and require very complicated circuitry as compared with the circuitry of a crossed-field amplifier. Accordingly, a need exists for a lightweight low volume crossed-field amplifier which could be employed in airborne applications.

SUMMARY OF THE INVENTION

Accordingly, it is an object of the present invention to provide a unique crossed-field amplifier which has a volume small enough and a weight which is light enough to be suitable for use in airborne applications.

It is a further object of the present invention to provide a crossed-field amplifier which has a gain high enough to be suitable for use with a solid state power source and yet has a wide bandwidth.

Still further objects will become apparent after a reading of the subject specification.

In accomplishing these and other objects, there is provided a miniature high gain crossed-field amplifier which has a peak power output of 750 to 1,250 watts and yet requires an RF input power of only 10 watts, thereby yielding an RF gain of 18 to 22 dB and yet at a bandwidth of 2 to 4%. The invented miniature high gain crossed-field amplifier occupies a volume of approximately 50 cubic inches and a weight of less than 10 pounds thereby making it suitable for airborne applications.

The foregoing is achieved in a miniature high gain crossed-field amplifier having an anode and a cathode and being charged with a voltage potential to create an electric field in a interaction area, the invented crossed-field amplifier comprising an anode having a slow wave structure, the slow wave structure having a plurality of radially extending vanes, the vanes having a predetermined pitch such that the distance between the plane of symmetry of each vane is substantially narrow as compared with the thickness of each vane, the vanes also having a predetermined length and height, the height being greater than half of the length. The invented crossed-field amplifier also includes a pair of helical coils disposed, respectively, about upper and lower regions of the plurality of vanes such that each turn thereof is disposed about a respective one of the plurality of vanes. The pair of helical coils are formed from a pair of wires having a substantially uniform cross-sectional thickness. Each turn of the coils have a predetermined substantially uniform plane of symmetry diameter, wherein the cross-sectional thickness of the wire is at least one order of magnitude less than the plane of symmetry diameter of each of the turns.

As such, the plane of symmetry diameter of each of the turns of the coils in relation to the cross sectional diameter of the coil, the pitch of the vanes, as well as the length and width thereof, promote high power gain while aiding in the dissipation of heat.

DETAILED DESCRIPTION OF THE INVENTION

Figure 1:
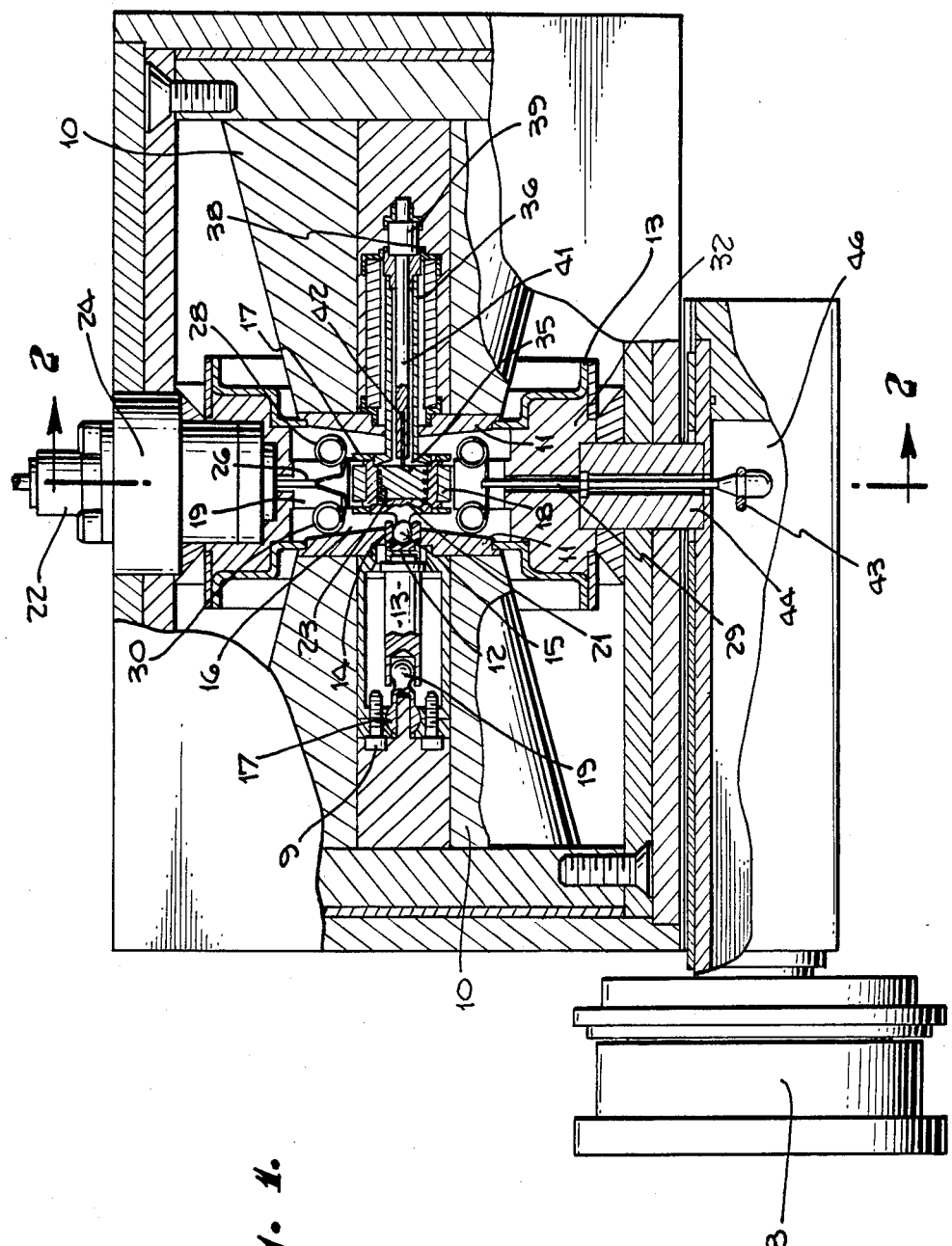
In FIG. 1 there is shown a longitudinally sectioned cross-sectional view of the invented high gain miniature crossed-field amplifier.

In FIG. 1 there is shown a cross-sectional view of the invented miniature high gain crossed-field amplifier which is designed to operate in the forward wave mode. The invented crossed-field amplifier has a pair of circular magnets 10 which, in the preferred embodiment, are comprised of samarium cobalt in order to allow the smallest and lightest construction while also providing a strong magnetic field. Disposed transversely across the inner ends of each magnet are circular-shaped pole pieces 11 which have a diameter substantially equal to the inner end diameter of the magnets 10. The pole pieces 11 are held in place by way of annular clips 13 as shown in FIG. 1. Moreover, the pole pieces 11 form the inner vacuum wall in order to provide minimal interference with the magnetic field therein.

Centrally disposed between the magnets 11 is a cathode which is generally denoted by reference numeral 16. The cathode 16, in the preferred embodiment, is a tungsten matrix dispenser cathode that will later be described in more detail. Disposed circumferentially about the cathode is an anode which is generally denoted by reference numeral 17 and which will later be described in more detail. The anode is a double helix coupled vane as is common in the art.

The invented crossed-field amplifier is supplied with a microwave input by way of an SMA series coaxial connector 22 which, in turn, is coupled to a coaxially mounted RF vacuum window 24, as is common in the art. The vacuum window 24 is coupled to a coaxial helix connector 26 which provides a balanced connection to the counterwound helical coils 28 and 30. The anode comprises a slow wave structure that includes the helical coils 28 and 30 and a plurality of radially extending vanes 19 which, in the preferred embodiment, are 66 in number. As may be observed from FIG. 1, the plane of symmetry diameter of a turn of the helical coils 28 and 30 (i.e., the diameter of a circular coil section measured from the midpoint of the thickness of the coil wire) are quite large as compared to the thickness of the helical coil wire. This ratio of cross-sectional thickness of the coil wire to the plane of symmetry diameter of the circular cross-section of the coil provides greater dispersion yielding a much higher dispersion curve and therefore also promoting a much greater output power gain than was heretofore possible with prior art crossed-field amplifiers.

The anode of the invented crossed-field amplifier further comprises an anode body 32 which, in the preferred embodiment, is comprised of OFE copper since such material has very high thermal conductivity properties and has excellent heat capacity.

Near the last output vane of the anode the output end of the helical coils 28 and 30 are coupled to a coaxially mounted output line 29 which, is in turn, mounted to a wave guide support block 44. The wave support block transforms the output RF to an output wave guide 46 by way of an RF septum 41 and end brace 43. The output wave guide 46 is coupled to an RF pillbox 48 as is common in the art.

The cathode of the invented crossed-field amplifier is comprised of non-emissive core material 20 comprised of aluminum oxide potting; a cathode base of refractory material 21, which is typically comprised of molybdenum; electron beam focusing end hats 17 which, in the preferred embodiment, are also comprised of molybdenum; emissive material 22 (not shown in FIG. 1) which may be comprised of a tungsten matrix; non emissive material 18; and a heater coil 23 which serves the purpose of heating the cathode so that the cathode may operate at peak capacity within the shortest possible time.

The cathode base of refractory material is coupled to a center knob 15 which, in turn, is frictionally disposed within an insulating bushing 14 which may be comprised of ceramic. The ceramic bushing 14 is disposed within a vacuum seal 12 which in turn, is coupled to a cathode centering member 13. The cathode centering member is, in turn, coupled to bulb member 19, which supports an adjusting bulb 17. The adjusting bulb is moved by screws 9 in order to adjust the cathode to the optimum electrical center of the vacuum area.

The region interior to the pole pieces 11 comprise the vacuum chamber of the crossed-field amplifier. A cathode support and voltage conduit 35 is disposed on the side of the cathode opposite the center knob 16. Support 35 provides a high voltage input to the cathode. Disposed concentrically about support 35 is a high voltage bushing 36, as shown in FIG. 1. coupled to the support 35 is an annular voltage input member 38 which supplies a high voltage D.C. input which to the cathode circuit. Concentrically disposed adjacent the cathode voltage input member is a heater bushing 39 which provides mechanical support and insulates the heater lead 41. The heater lead 41 is, in turn, coupled to a heater filament 42, which runs into the base of the cathode and is coupled to the aforementioned heater coil 23.

In the preferred embodiment the D.C. input voltage requirement is approximately 2.0 to 2.5 Kv. which is low as compared to prior art crossed-field amplifiers which typically require 10 to 13 Kv. Moreover, the RF power input requirement, since the invented crossed-field amplifier provides such an exceptionally high gain, is only 10 watts which may be provided by a solid state 10 watt RF power source. This is a dramatic improvement over prior art crossed-field amplifiers which require an RF input power of 1.6 kilowatts or more. The low RF input power requirement of the present invention enables it to utilize a solid state power source which avoids the more complicated, costly and heavier RF power source utilized by the prior art.

Figure 2:
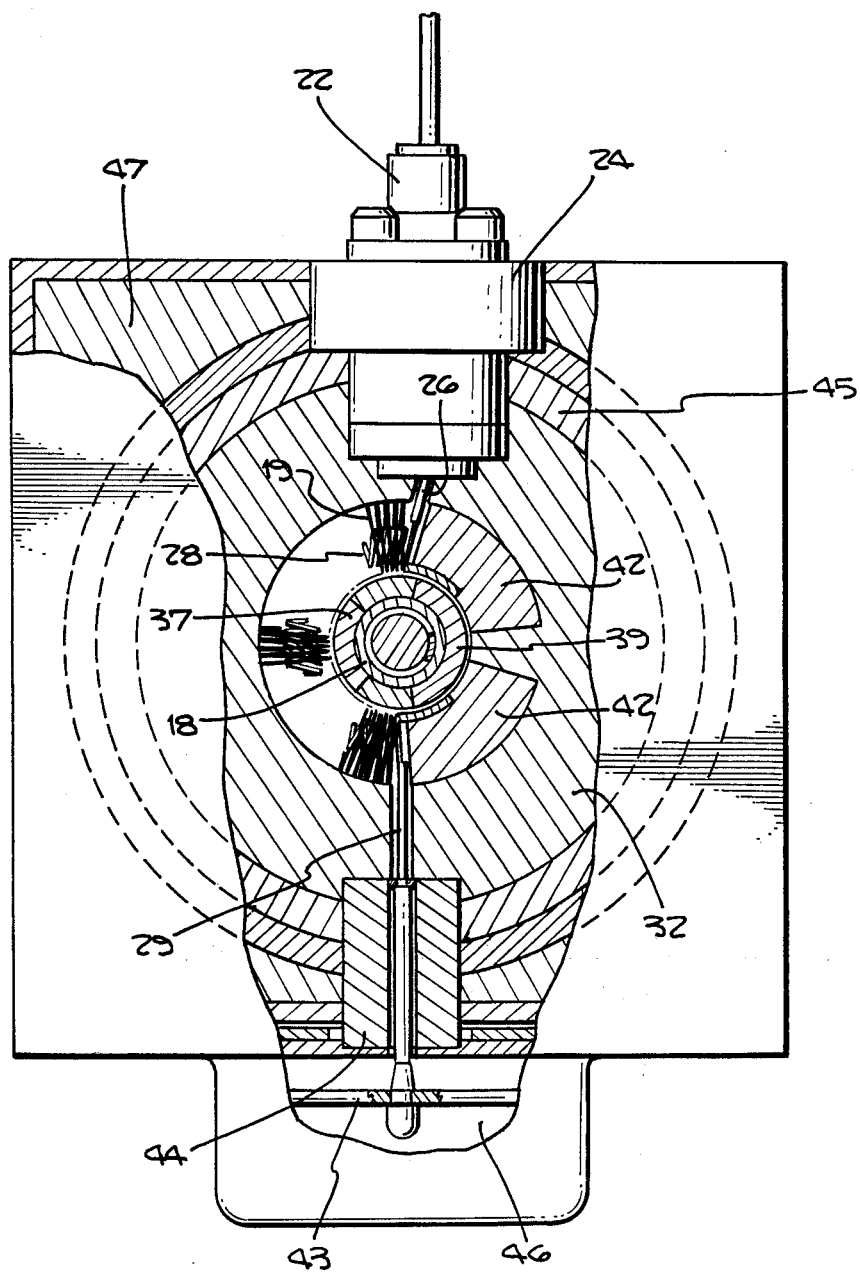
In FIG. 2 there is shown a top plan cross-sectional view taken along lines 2—2 of FIG. 1.

In FIG. 2 there is shown a top plan cross sectional view of the invented miniature crossed-field amplifier wherein the elements previously described with reference to FIG. 1 are denoted by the same reference numerals.

In the center of the cathode is the aluminum oxide potting 36 which serves as a core for the cathode. Adjacent the outer periphery of the cathode potting 36 is the heater coil 23. Disposed circularly around the cathode potting 36 is the cathode base 21. Disposed circularly about the cathode base 21 is an electric field creating emissive material 37 which, in the preferred embodiment, is disposed in three separate sections occupying approximately 200° of the cathode. Opposite the emissive material of the cathode is non-emissive material 39 which, in the preferred embodiment, is comprised of molybdenum.

Surrounding approximately 150° to 220° of the cathode are the previously described anode vanes 19 and helical coils 28 and 30. As is shown in FIG. 2, the distance between each vane is smallest at the ends nearest the cathode. In the preferred embodiment this distance is approximately 0.004 inches. The vane, in the preferred embodiment, is approximately 0.007 inches thick such that the pitch of the vanes is approximately 0.011 of an inch. The vanes of the invented crossed-field amplifier are precision-machined by a wire electro discharge machine in order to accomplish the aforementioned precise dimensions. The pitch of prior art crossed-field amplifiers have typically been on the order of 0.075 of an inch. It has been discovered by the inventors of the present invention that such a small pitch is critical to the high gain and low volume of the invented crossed-field amplifier.

Moreover, as shown in FIG. 1, the height of the vane approaches the length thereof. Prior art anode vanes typically have a height of 1 inch and a length of 2 inches. In the preferred embodiment the height of the vane is approximately 0.200 inches while the length of the vane is approximately 0.235 inches such that the vanes occupy a wide surface area which greatly improves the vane's ability to dissipate the thermal electron impact energy dissipated by the anode structure such that heat conductivity of the anode vanes is greatly improved while thermal resistance thereof is greatly minimized, as compared with the prior art. The helical coils 28 and 30 are positioned on the outer regions of the anode vane such that there is a proportionately large distance between each coil which greatly reduces thermal impedance of the anode slow wave structure. The distance between the helices of the invented miniature crossed-field amplifier is, in the preferred embodiment, approximately 0.138 inches. This distance is much larger in proportion to the scale of power and frequency that has previously been practiced in the art.

It is also important to note that the interaction area parameters have been reduced to the smallest practicable dimensions. In the preferred embodiment the cathode/anode gap is approximately 0.0123 inches wide. Typical prior art cathode/anode gaps are approximately 0.084 inches wide. The reduced interaction area promotes a higher RF power gain as compared to the prior art.

Referring again to FIG. 2, disposed circumferentially opposite the slow wave structure of the anode are copper drift sections 42 which contains no RF slow wave structure and provide a drift path for electron beam reentrancy. Disposed about the drift sections and slow wave structure of the anode is the circular anode body 32. The slow wave structure of the anode and the drift sections are coupled to the anode body. Disposed about the anode body 32 is a copper heat sink 45 which, in the preferred embodiment, is also comprised of OFE copper in view of the aforementioned thermal properties of copper. Surrounding the heat sink 45 is a steel magnetic circuit return path 47 as is common in the art.

Enclosing the invented crossed-field amplifier is an aluminum housing which serves as a mechanical packaging while also protecting against degaussing of the magnetic circuit.

The above described invented crossed-field amplifier yields a peak power output within the range of approximately 750 to 1,250 watts while requiring an input RF drive power of only 10 watts. The duty cycle is 0.25 to 0.4 while the gain is 18 to 22 dB at a bandwidth of 2 to 4%. The invented crossed-field amplifier also has a higher efficiency than the aforementioned traveling wave tubes. The efficiency ratio of the invented crossed-field amplifier is 30 to 35% while efficiency ratio of 25%. Moreover, the weight of the invented crossed-field amplifier is less than 10 pounds while the volume thereof is approximately 50 cubic inches. It will therefore be appreciated that the invented crossed-field amplifier has achieved a dramatic improvement in gain without sacrificing bandwidth and has also achieved a dramatic reduction in volume and weight as compared to prior art crossed-field amplifiers which at a minimum typically approach a weight of 25 pounds.

As such it will be readily apparent to those skilled in the art that the invented miniature high gain crossed-field amplifier has exceeded beyond the known performance envelope for forward wave crossed-field amplifiers thereby making a relatively simple fundamental forward wave crossed-field amplifier available for airborne applications.

It will be further appreciated that the present invention may be embodied in other specific forms without departing from the spirit or essential characteristics thereof. The present embodiments are to be considered in all aspects as illustrative and unrestrictive, the scope of the invention being indicated by the appended claims rather than by the foregoing description, and all changes which come within the meaning and range of equivalency are, therefore, intended to be embraced therein.

What is claimed is:

1. A miniature high gain crossed-field amplifier having an anode and a cathode and being charged with a voltage potential to create an electric field in an interaction area, said crossed-field amplifier comprising:

an anode having a slow wave structure, said slow wave structure having a plurality of radially extending vanes, said vanes having a predetermined pitch and a plane of symmetry such that the distance between the plane of symmetry of each vane is substantially narrow as compared with the thickness of each said vane, said vanes also having a predetermined length height, said height being greater than half of said length;

a pair of helical coils disposed, respectively, about upper and lower regions of said plurality of vanes such that each turn thereof is disposed about a respective one of said plurality of vanes, said pair of helical coils formed from a pair of wires having a substantially uniform cross-sectional thickness, each turn of said pair of coils having a predetermined substantially uniform plane of symmetry diameter, wherein said cross-sectional thickness of said wire is at least one order of magnitude less than said plane of symmetry diameter of each of said turns;

whereby the plane of symmetry diameter of each of said turns of said pair of coils in relation to the cross-sectional diameter of said wires, the pitch of said vanes, as well as the length and width thereof, promote high power gain while aiding in dissipation of heat.

2. The apparatus according to claim 1 wherein each of said vanes has a pitch ratio which is less than one half of the thickness thereof.

3. The apparatus according to claim 1 wherein said plane of symmetry diameter of said helical coils is approximately 0.117 inches and wherein said cross-sectional thickness is approximately 0.005 inches.

4. The apparatus according to claim 1 wherein said plane of symmetry diameter is separated by a predetermined distance, said predetermined distance being greater than one half of the height of said plurality of vanes.

5. The apparatus according to claim 4 wherein said distance between said plane of symmetry diameter of said turns of said helical coil is approximately 0.138 inches.

6. The apparatus according to claim 1 wherein said pitch of said vanes is approximately 0.011 inches.

7. The apparatus according to claim 1 herein each of said vanes have a predetermined thickness which is approximately 0.007 inches.

8. An apparatus as claimed in claim 1 wherein said apparatus further comprises:

a means for providing an input RF power gain of 18 to 22 dB;

a housing structure, said housing structure enclosing said crossed-field amplifier in a volume near about 50 cubic inches.

9. The apparatus according to claim 1 wherein said crossed-field amplifier has a weight of approximately 10 pounds.

* * * * *